Figure 1:
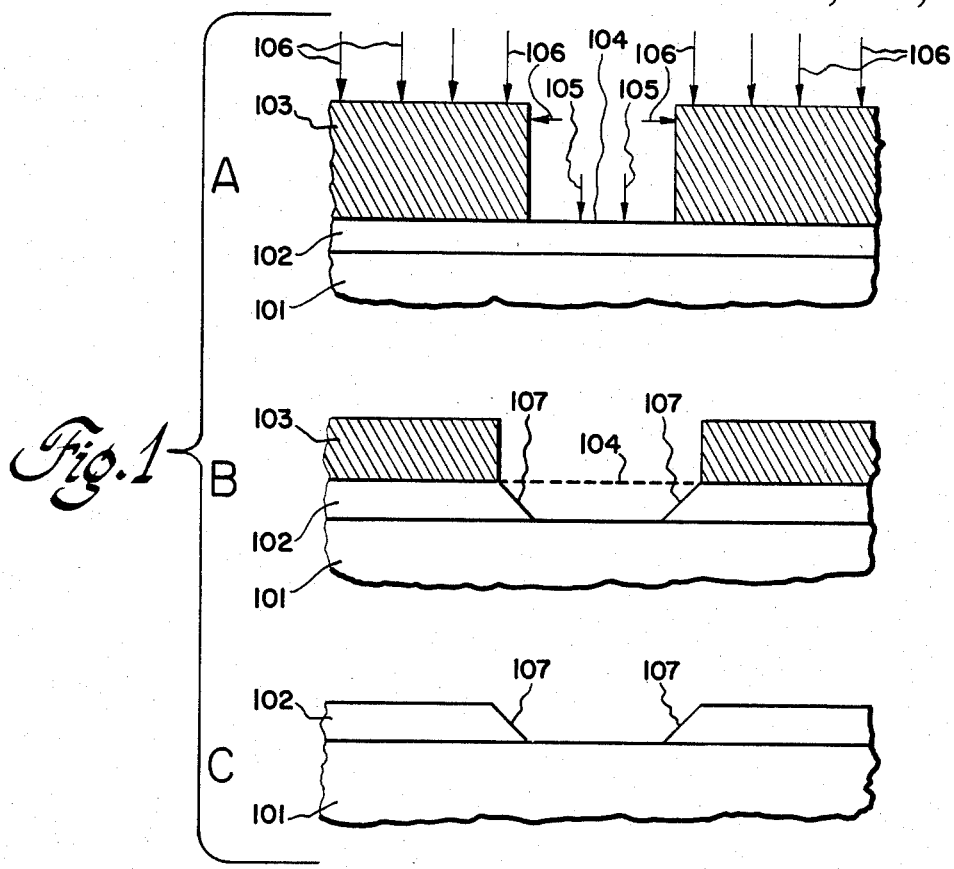

United States Patent [19]

Gorowitz et al.

[11] Patent Number: 4,522,681
[45] Date of Patent: Jun. 11, 1985

[54] METHOD FOR TAPERED DRY ETCHING

[75] Inventors: Bernard Gorowitz, Clifton Park; Richard J. Saia, Scotia, both of N.Y.

[73] Assignee: General Electric Company, Schenectady, N.Y.

[21] Appl. No.: 602,873

[22] Filed: Apr. 23, 1984

[51] Int. Cl.³ .................. B44C 1/22; C03C 15/00; C03C 25/06
[52] U.S. Cl. .................. 156/643; 156/644; 156/646; 156/653; 156/657; 156/659.1; 156/668; 204/192 E; 252/79.1
[58] Field of Search ............... 156/643, 646, 653, 657, 156/659.1, 644, 668; 204/164, 192 E; 252/79.1; 427/38, 39

[56] References Cited

U.S. PATENT DOCUMENTS 3,986,912 10/1976 Alcorn et al. .................. 204/192 E
4,092,210 5/1978 Hoepfner .......................... 156/643
4,293,375 10/1981 Neukomm ........................ 156/643

OTHER PUBLICATIONS

Weiss, *Semiconductor International*, Feb. 1983, pp. 56-62, Plasma Etching of Oxides and Nitrides.
Weiss, *Semiconductor International*, Nov. 1983, pp. 114-118, Etching Systems.
Viswanathan, *J. Vac. Sci. Technol.*, vol. 16, No. 2, pp. 388-390, (1979), Simulation of Plasma-etched Lithographic Structures.

*Primary Examiner*—William A. Powell
*Attorney, Agent, or Firm*—William H. Pittman; James C. Davis, Jr.; James Magee, Jr.

[57] ABSTRACT

Holes in substrates are produced by a photolithography-plasma dry etching method employing a positive photoresist mask such as poly(methyl methacrylate) which is capable of being isotropically eroded by plasma action. The result is simultaneous anisotropic etching of the substrate and isotropic erosion of the mask, producing tapered holes.

11 Claims, 6 Drawing Figures

METHOD FOR TAPERED DRY ETCHING

This invention relates to dry etching processes, and more particularly to the production thereby of tapered holes in substrates.

The use of photolithography and etching techniques to produce holes in substrates is known. The production of such holes in dielectric layers on semiconducting wafers and chips is an important operation in the manufacture of miniaturized electronic circuits. For example, holes may be etched in a dielectric layer and a metallic layer subsequently deposited on said dielectric, whereupon the metal fills the holes and provides contact with the underlying conductive or semiconductive layer.

With the increasing miniaturization of circuits of this type, methods for producing extremely small holes are extremely important. Most suitable methods include dry etching procedures such as plasma and reactive ion etching, which can produce holes with dimensions on the order of 1 micrometer.

The etching direction in operations of this type is substantially anisotropic, producing holes with substantially vertical sidewalls. As a result, step coverage problems are encountered during metallization, with the metal layer being substantially thinner on the sidewalls of the hole than elsewhere. These metal thickness irregularities can give rise to cracking and variations in resistance which may cause malfunctioning or occasionally total failure of the circuit.

In order to minimize these problems, efforts have been made to develop methods for producing holes with sloped profiles. One method of doing this has been to form a conventional (e.g., novolac) photoresist mask which itself has a tapered profile. Since the mask is anisotropically eroded to some degree by the etching medium as the substrate is etched, the result is replication of the mask profile, more or less, in the substrate. However, variables such as lithographic exposure conditions, surface topography and hole size affect hole profiles and dimensions and make precision control by this method difficult or impossible.

A principal object of the present invention, therefore, is to provide an improved dry etching method.

A further object is to provide a plasma etching method employing a positive photoresist which is capable of producing holes with sloped profiles.

A further object is to provide a method for closely controlling the hole profile during the etching process.

A still further object is to accomplish the foregoing by a process which accomplishes lateral etching of a photoresist mask, making use of inherent properties of the photoresist material.

Other objects will in part be obvious and will in part appear hereinafter.

The present invention is based on a property of certain photoresist materials which, while known in the art, has been considered a disadvantage rather than an advantage. That property is the susceptibility of such materials to erosion. It has been discovered that said erosion is substantially isotropic, making it possible to produce anisotropic etching results by the use of controlled isotropic photoresist erosion during the etching process.

In its broadest sense, the invention includes a dry etching method which comprises the steps of:

(A) forming on a substrate a positive mask having substantially vertical edges from a polymeric photoresist material capable of being isotropically eroded by plasma action;

(B) contacting the masked substrate with a plasma under conditions producing both anisotropic etching of said substrate and controlled isotropic erosion of said mask, and continuing plasma contact until the desired end point has been reached, thereby producing at least one tapered hole in said substrate.

Before proceeding with a detained description of the invention, it is necessary to define certain terms used herein. The word "hole" is used in a generic sense to include grooves and other concavities produced by etching substrates. The word "isotropic" means multi-directional; that is, proceeding in both a vertical and a lateral direction. Conversely, "anisotropic" is used in its art-recognized sense to denote movement in a vertical direction only. "Degree of taper" of an etched hole is the angle of the sidewall with the horizontal.

The substrates which may be etched by the method of this invention include inorganic dielectric materials, which are generally ceramic substances such as silicon dioxide, silicon nitride, silicon oxynitride and mixtures thereof. Silicon dioxide is at present by far the most commonly used dielectric material, and its use is preferred. In many applications of the invention, the dielectric material forms a layer on a conductive or semiconductive base such as metal, silicon, polysilicon, gallium arsenide or germanium.

In step A of the method of this invention, a positive mask of a photoresist material is formed on the surface of the substrate. The photoresist material is one which is capable of being isotropically eroded by plasma action. Such materials are known to those skilled in the art; they include addition polymers having relatively low heats of polymerization and relatively high glass transition temperatures. Many of such polymers contain repeating units having the formula

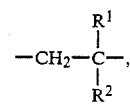

wherein $R^1$ is a $C_{1-4}$ alkyl radical, $R^2$ is $COR^3$ or $COOR^4$, $R^3$ is a $C_{1-4}$ alkyl radical and $R^4$ is a $C_{1-4}$ alkyl radical or a mixture of such radicals and hydrogen. Thus, addition polymers useful as photoresists include homopolymers of methyl methacrylate, ethyl methacrylate and methyl isopropyl ketone, as well as copolymers thereof with methacrylic acid. Particularly preferred are poly(methyl methacrylate) and poly(methyl isopropenyl ketone), especially the former.

The photoresist mask is formed on the substrate surface by conventional methods including the steps of coating, exposure and development. The exposure and development steps are performed in such a way that the edges of the formed mask are substantially vertical. This may be accomplished by methods known in the art, typically involving the use of two-level resists optionally with a protective layer between the two levels followed by removal of the upper level and the protective layer. Reference is made, for example, to U.S. Pat. Nos. 4,360,585 and 4,362,998, the disclosures of which are incorporated by reference herein. In most instances, the photoresist mask is relatively thick, typically about 1-2 microns.

In step B, the masked substrate surface is contacted with a plasma under etching conditions. A wide variety of plasma gases are suitable for use according to the invention; in general, they comprise at least one fluorine compound such as trifluoromethane, tetrafluoromethane, hexafluoroethane or nitrogen trifluoride, usually in admixture with inert gases such as helium or argon. Fluorine compounds of this type, upon conversion to the plasma state, produce excited neutral and ionized species which react with the dielectric layer to form volatiles such a silicon tetrafluoride, thereby etching away said layer and producing the desired holes.

The choice of plasma gases is also made so as to achieve controlled erosion of the photoresist mask. This is generally accomplished by incorporating at least one oxidizer in the plasma. Oxygen is a preferred oxidizer by reason of this effectiveness and relative economy of use. Nitrogen trifluoride is itself an oxidizer and when it is used no additional oxidizer is necessary. However, the incorporation of an auxiliary oxidizer such as oxygen may be beneficial as described hereinafter, since it is itself an eroding species and also promotes the formation of radical fluorine eroding species.

The etching conditions are conventional. They may be those of ordinary plasma etching, which typically involve relatively high pressures (generally in the range of about 1–10 torr) and power densities (about 1–10 watts/cm.$^2$) and which produce etching rates of the order of 2000–5000 A. (Angstroms) per minute. Alternatively, reactive ion etching conditions may be employed; these generally include lower pressures (typically about 0.01–0.2 torr) and power densities (about 0.1–0.5 watt/cm.$^2$), and the resulting etching rates are somewhat lower.

The effect of the plasma on the substrate is to produce anisotropic etching thereof. At the same time, it produces isotropic erosion of the photoresist mask, principally as a result of the action of neutral species such as atomic oxygen and fluorine provided by the oxidizer. The rate of erosion of the mask varies directly with the proportion of oxidizer in the plasma and controls the angle at which the hole in the substrate is tapered, so that the degree of taper varies inversely with the proportion of oxidizer. Thus, it is possible to predetermine the degree of taper by adjusting the proportions of the plasma constituents.

The etching operation is continued until the desired hole or holes in the substrate have been produced, as shown by conventional end point detection methods. Any remaining photoresist may then be conventionally removed and the substrate is ready for further processing or use.

Reference is now made to FIG. 1 which is a schematic cross-sectional view of the effect of the method of this invention on the production of a hole in a poly(-methyl methacrylate)-masked silicon dioxide dielectric. In FIG. 1(A), there is shown a conductive wafer comprising silicon conductor 101 with silicon dioxide coating 102, which is typically 4000–5000 A. thick, thereon. Poly(methyl methacrylate) mask 103, typically with a thickness of 15,000 A., is applied on the silicon dioxide layer and is exposed and developed so as to expose surface area 104 of the silicon dioxide layer for etching. Upon exposure to a plasma containing an oxidizer, silicon dioxide layer 102 is anisotropically etched as indicated by vertical arrows 105. At the same time, the oxidizer in the plasma causes isotropic erosion of mask 103, as denoted by vertical and horizontal arrows 106.

FIG. 1(B) depicts a later stage of the etching process. At this point, mask 103 has been substantially eroded in both vertical and lateral directions, resulting in a hole with tapered sidewalls 107 in dielectric layer 102. Upon removal of the mask, there is obtained the etched product shown in FIG. 1(C), including the completed hole with tapered sidewalls 107 in dielectric layer 102.

The method of this invention is illustrated by the following examples. All gas percentages and proportions are by volume.

EXAMPLE 1

A silicon wafer coated with a 4000 A. layer of silicon dioxide was masked with a poly(methyl methacrylate) photoresist, which was then exposed and developed conventionally in such a way as to produce holes in the silicon dioxide layer of approximately 1.5-micrometer size upon plasma etching. The wafer was etched in a parallel plate reactive ion etching system, using a gas mixture of 76% argon, 20% nitrogen trifluoride and 4% oxygen. The etching conditions were as follows:

Frequency—13.56 mHz.
Power—300 watts (0.25 watt/cm.$^2$)
Cathode cover—Carbon
Gas flow—50 sccm. (standard cubic centimeters per minute)
Pressure—100 mtorr.

Under these conditions, the lateral erosion rate of the poly(methyl methacrylate) was approximately equal to the vertical etch rate of the silicon dioxide (330 A./min.) The vertical etch rate of the poly(methyl methacrylate) was 1130 A./min.

Figure 5:
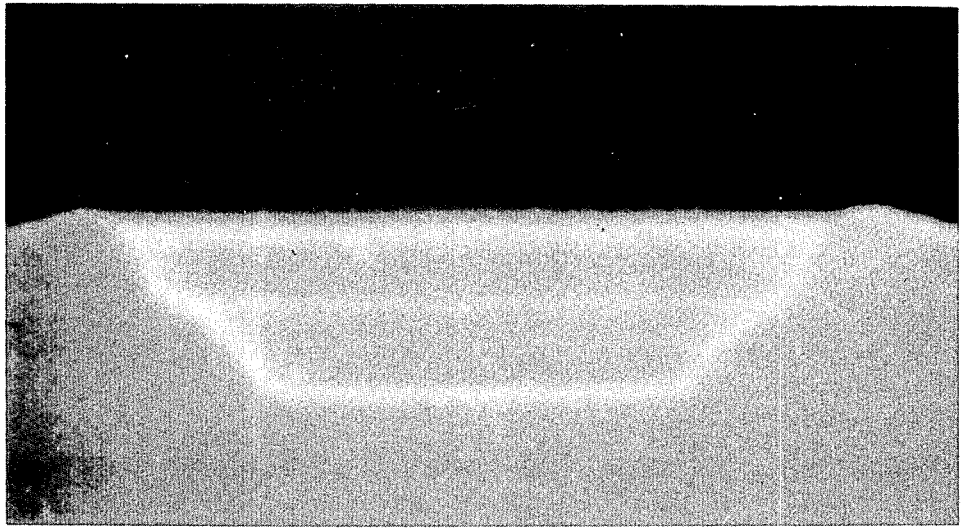

FIG. 5 is a scanning electron photomicrograph of the hole thus produced. As is apparent, the degree of taper was approximately 45°.

EXAMPLE 2

The procedure of Example 1 was repeated, using a gas mixture of 80% argon and 20% nitrogen trifluoride and with oxygen absent. The lateral erosion rate of the mask was only about half the vertical etch rate of the silicon dioxide. The degree of taper was about 65°.

Figure 2:
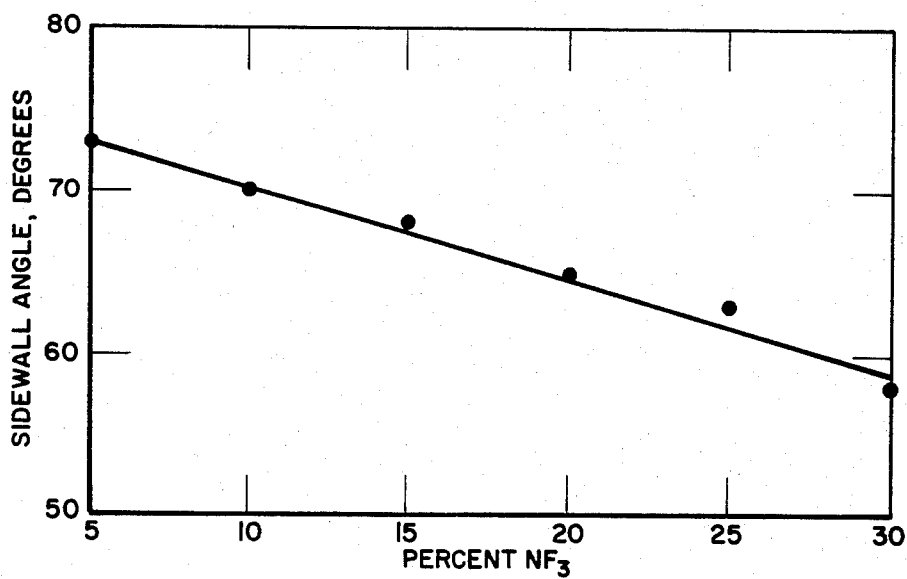

The procedure was repeated using various proportions of argon and nitrogen trifluoride in the gas mixture. FIG. 2 is a graphical representation of the variation of the degree of taper with the percentage of nitrogen trifluoride therein.

EXAMPLE 3

Figure 3:
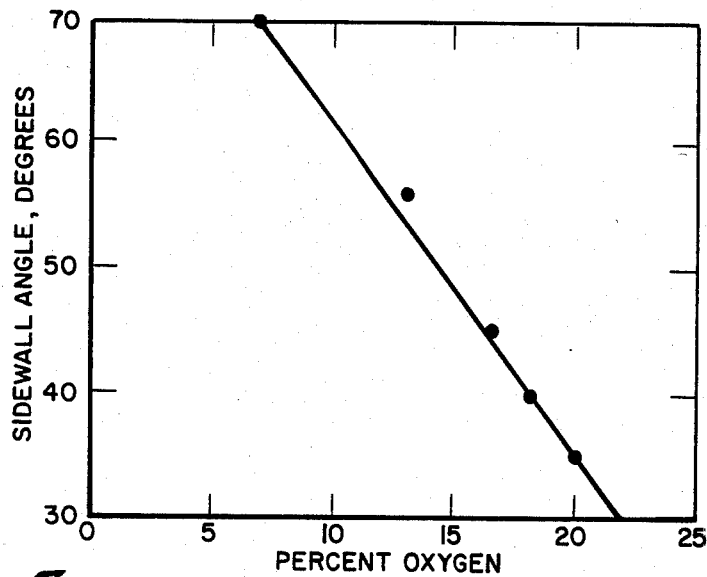

The procedure of Example 1 was repeated, using a gas mixture containing argon and trifluoromethane in a 3:5 ratio and, in addition, various proportions of oxygen. FIG. 3 is a graphical representation of the relationship between content (as a percentage of total oxygen in the gas mixture) and the degree of taper.

EXAMPLE 4

Figure 4:
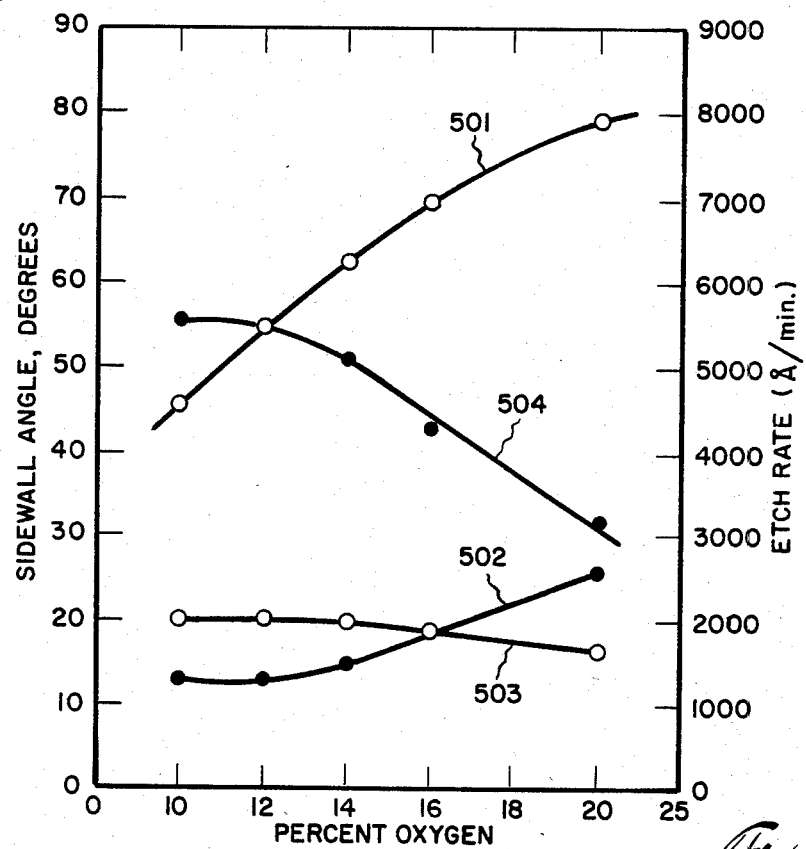

Wafers similar to that described in Example 1, and similarly masked, were etched with a gas mixture containing hexafluoroethane and helium in a 1:4 ratio and various proportions of oxygen, in a plasma etcher operated at 400 watts, a pressure of 2.7 torr and a combined hexafluoroethane-helium gas flow of 50 sccm. The results are depicted graphically in FIG. 4, with curves 501, 502 and 503 respectively representing the relationship between oxygen content (as a percentage of the gas mixture) and the vertical erosion rate of the mask, lateral erosion rate of the mask and etch rate of the silicon dioxide, and curve 504 representing the relationship between oxygen content and degree of taper.

Figure 6:
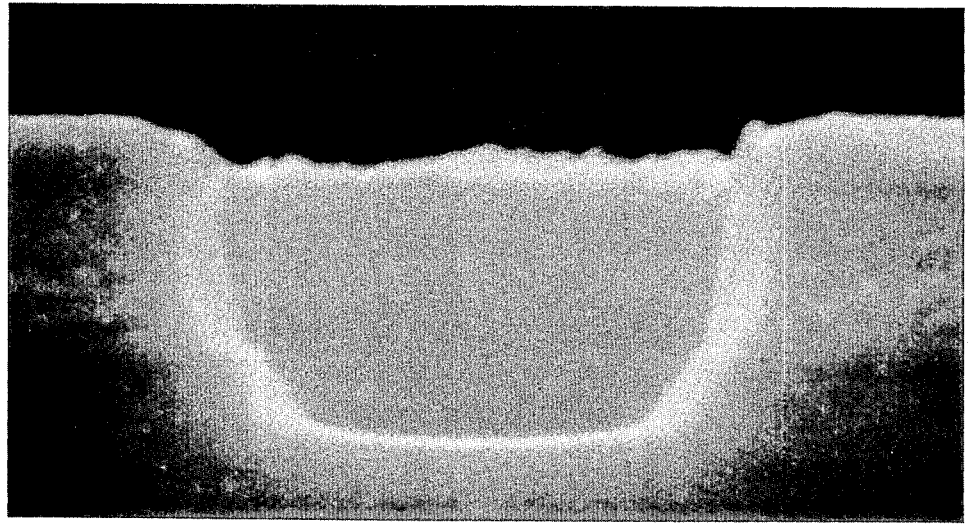

FIG. 6 is a photomicrograph of the hole produced by the use of a gas mixture containing 10% oxygen. The approximately 55° degree of taper is apparent.

What is claimed is:

1. A dry etching method which comprises the steps of:
   (A) forming on a substrate a positive mask having substantially vertical edges from a polymeric photoresist material capable of being isotropically eroded by plasma action;
   (B) contacting the masked substrate with a plasma under conditions producing both anisotropic etching of said substrate and controlled isotropic erosion of said mask, and continuing plasma contact until the desired end point has been reached, thereby producing at least one tapered hole in said substrate.

2. A method according to claim 1 wherein the photoresist material is poly(methyl methacrylate).

3. A method according to claim 2 wherein the substrate is an inorganic dielectric material.

4. A method according to claim 2 wherein the plasma comprises at least one fluorine compound and at least one oxidizer.

5. A method according to claim 4 wherein the fluorine compound is at least one of trifluoromethane, tetrafluoromethane, hexafluoroethane and nitrogen trifluoride.

6. A method according to claim 5 wherein at least a portion of the oxidizer is oxygen.

7. A method according to claim 6 wherein the dielectric material is silicon dioxide.

8. A method for dry etching a silicon dioxide substrate which comprises the steps of forming on said substrate a positive poly(methyl methacrylate) mask having substantially vertical edges, and contacting the masked substrate under plasma etching conditions with a plasma comprising oxygen and at least one fluorine compound selected from the group consisting of trifluoromethane, tetrafluoromethane and hexafluoroethane, thereby producing both anisotropic etching of said substrate and controlled isotropic erosion of said mask, and continuing plasma contact until the desired end point has been reached, thereby producing at least one tapered hole in said substrate.

9. A method according to claim 8 wherein the fluorine compound is hexafluoroethane.

10. A method for dry etching a silicon dioxide substrate which comprises the steps of forming on said substrate a positive poly(methyl methacrylate) mask having substantially vertical edges, and contacting the masked substrate under reactive ion etching conditions with a plasma comprising nitrogen trifluoride, thereby producing both anisotropic etching of said substrate and controlled isotropic erosion of said mask, and continuing plasma contact until desired end point has been reached, thereby producing at least one tapered hole in said substrate.

11. A method according to claim 10 wherein the plasma also contains oxygen.

* * * * *